United States Patent [19]

Kawamura

[11] Patent Number: 4,875,133
[45] Date of Patent: Oct. 17, 1989

[54] SIMULATING STATICELECTRICITY DISCHARGES

[75] Inventor: Takeyoshi Kawamura, Yokohama, Japan

[73] Assignee: Sanki Electronic Industry Co., Ltd., Yokohama, Japan

[21] Appl. No.: 838,387

[22] Filed: Mar. 11, 1986

[30] Foreign Application Priority Data

Mar. 12, 1985 [JP] Japan ............................ 60-049733

[51] Int. Cl.$^4$ .................... H05F 3/04; G01R 29/12
[52] U.S. Cl. ................................. 361/230; 324/457
[58] Field of Search ................. 361/230, 126; 324/72, 324/72.5, 457, 458, 109, 122; 310/308–310; 313/54, 581

[56] References Cited

U.S. PATENT DOCUMENTS 3,388,274  3/1968  Kawiecki ................. 361/120 X
4,742,427  5/1988  Richman ..................... 361/230

FOREIGN PATENT DOCUMENTS 892787 of 1953 Fed. Rep. of Germany.

OTHER PUBLICATIONS

Electromagnetic Compatibility for Industrial-Process Measurement and Control Equipment Part 2: Electrostatic Discharge Requirements 1984, International Electrotechnical Commission IEC Standard Publication 801–2.
EDS Testing: The Interface Between Simulator and Equipment Under Test, pp. 1–7, Richman et al., 1985 Proceedings of 6th EMC Symposium, Zurich 1985: "EMC 1985", KeyTek Instrument Corp. Application Note AN 151.
Radiation From a Pulse Discharge, pp. IID 515–517, Porter et al., Proceedings of 4th Internat'l Conference on Ionization Phenomena in Gases, N. R. Nilsson, vol. 1, North-Holland Pub. Co., Amsterdam, 1960.
Radio Fernsehen Elektronik, vol. 33, No. 5, May 1984, pp. 321–326, East-Berlin, D. D; W. Liess.
Instruments & Experimental Techniques, vol. 1, Jan.-/Feb. 1966, pp. 120–122. Plenum Publishing Corp., New York, U.S.; V. V. Kremnev.
Instruments & Experimental Techniques, vol. 20, No. 4/2, Jul./Aug. 1977, pp. 1107–1109, Plenum Publishing Corp., New York, U.S.; M. G. Nikiforov.

Primary Examiner—L. T. Hix
Assistant Examiner—D. Rutledge
Attorney, Agent, or Firm—Bachman & LaPointe

[57] ABSTRACT

An apparatus for simulating electrostatic discharge used for testing and evaluating the durability and sensitivity of electronic parts and assemblies such as IC's, LSIs, and so on, to electrical overstresses and electromagnetic interference caused by electrostatic discharges. In the apparatus, an additional electrostatic capacitance element is connected across a discharge gap within which an electrostatic discharge occurs so that the discharge current through the tested object exhibits a shortened rise time and an increased peak value.

19 Claims, 8 Drawing Sheets

FIG. II
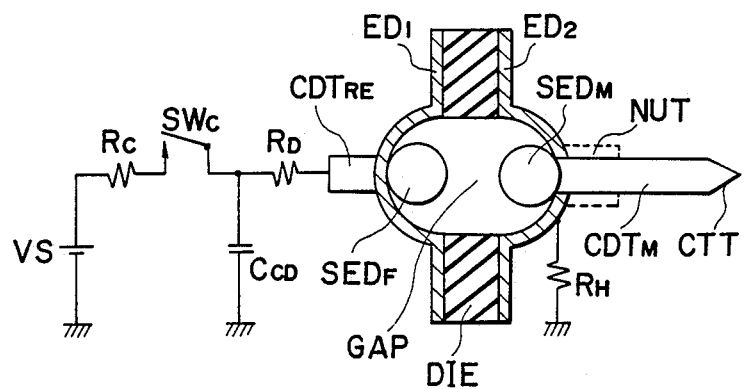
FIG. 12
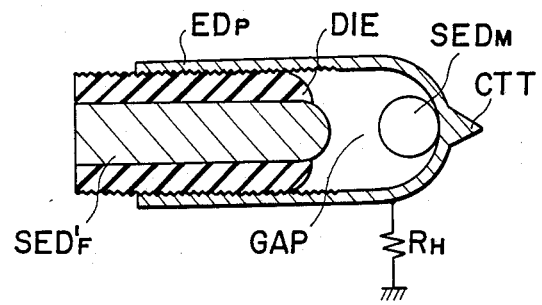

SIMULATING STATIC ELECTRICITY DISCHARGES

BACKGROUND OF THE INVENTION

The present invention relates to an apparatus for simulating electric-static discharges artificially. The present invention relates more specifically to a static-electricity generation simulator used to test and evaluate sensitivities and immunity characteristics of electronic assemblies to electrical overstress or electromagnetic interference caused by electrostatic discharges. The term "electronic assemblies" includes large scale integration circuitry (LSI), standard integrated circuitry (IC), miniaturized electronic parts, and various other electronic equipments.

Electrostatic discharges in the various kinds of electronic components and electronic apparata described above are mainly caused by electrified objects isolated from the earth, especially, among other things, by charged human bodies. Hence, most of electrostatic discharge simulators are modeled as equivalents to charged human bodies.

FIG. 1 shows the lay-out of a conventional electrostatic discharge simulator circuit. The conventional simulator shown in FIG. 1 is disclosed in a publication document by IEC (International Electrotechnical Committee) publication No. 801.2 in 1984 (Page 24).

In FIG. 1, the symbols $C_{CD}$ and $R_D$ denote a charge-and-discharge capacitor having an electrostatic capacity equivalent to that of a human body and a discharge resistor having a resistance value equivalent to that of the human body, respectively. The symbol SED denotes a charged electrode which usually comprises a ball-shaped or needle-tip-shaped (tapered) electrode. The symbol GAP denotes a discharge gap and TO denotes a specimen (object to be tested) such as an electronic component. As the discharge electrode SED gradually approaches the specimen TO or directly touches the specimen while the charge-and-discharge capacitor $C_{CD}$ is charged to a predetermined voltage $V_o$, the electric charge on the charge-and-discharge capacitor $C_{CD}$ is instantaneously transferred to the specimen TO by a spark discharge generated when the product of the size of the discharge gap GAP and atmospheric pressure reaches a value according to the charged voltage of the charge-and-discharge capacitor $C_{CD}$ or by electrical contact.

Since the voltage across the human body can often reach several kilovolts to approximately 15 through 16 kilovolts and in special cases it reaches a maximum a discharge start voltage of approximately 35 through 36 kilovolts, the voltage $V_o$ across the charge-and-discharge capacitor $C_{CD}$ can be set over a voltage range from zero volts to approximately 35 through 36 kilovolts, which clearly accords with the voltages of the electrified human body. Although the equivalent resistance value of the discharge resistor $R_D$ and electrostatic capacitance value of the charge-and-discharge capacitor $C_{CD}$ are also determined according to the actual values of the charged human body, these values change over a considerably wide range. However, in this example, the equivalent electrostatic capacitance of the charge-and-discharge capacitor $C_{CD}$ has a fixed value appropriately selected from the range of 50 picofarads to 250 picofarads and the equivalent resistance of the discharge resistor $R_D$ has a fixed value appropriately selected from the range of 100 ohms to 1500 ohms.

The discharge current of the conventional electrostatic discharge simulating apparatus shown in FIG. 1 will be described below.

The waveform of the discharge current can be principally expressed as an exponential curve as shown in FIG. 2 if the impedance of the specimen TO is negligible. In FIG. 2, the horizontal axis denotes elapsed time t, the vertical axis denotes a current i, $t_o$ denotes the time at which current discharge starts and $$I_p \left( = \frac{V_o}{R_o} \right)$$

denotes the peak current, which appears at the time $t_o$ of discharge start. A discharge time constant $\tau$ can be expressed as follows:

$$\tau = C_{CD} \cdot R_D$$

On the other hand, the discharge current i can be expressed as follows:

$$i = \left( \frac{V_o}{R_D} \right) \exp \left( \frac{-t}{R_D \cdot C_{CD}} \right)$$

wherein $C_{CD}$ denotes the electrostatic capacitance of the charge-and-discharge capacitor $C_{CD}$ and $R_D$ denotes the resistance of the discharge resistor $R_D$.

However, the actual waveform of the discharge current differs from the theoretical waveform shown in FIG. 2 due to some factors specific to spark discharge phenomena. FIGS. 3(a) through 3(d) illustrate actual waveforms of the discharge current described above (the horizontal and vertical axes are as shown in FIG. 2). It should be noted that in FIGS. 3(a) through 3(d) the electrostatic capacitance of the charge-and-discharge capacitor $C_{CED}$ is a constant value, i.e., 120 picofarads, the resistance of the discharge resistor $R_D$ is a constant value, i.e., 250 ohms, and the charge voltage $V_o$ across the charge-and-discharge capacitor $C_D$ (the discharge start voltage at the discharge gap GAP, i.e., the same as the breakdown voltage of air across the discharge gap) is $V_o = 0.5$ kilovolts in FIG. 3(a), $V_o = 3$ kilovolts in FIG. 3(b), $V_o = 7$ kilovolts in FIG. 3(c), and $V_o = 15$ kilovolts in FIG. 3(d). As appreciated from FIGS. 3(a) through 3(d), the waveform of discharge current varies as the voltage $V_o$ varies.

The pattern of change in the waveform of the discharge current also appears in observations on the actual waveforms of the discharge current generated during electrostatic discharges from the human body. The causes of these aberration have not been investigated previously because they so closely resemble the characteristics of electrostatic discharge from human bodies.

However, repeated experiments by the Applicant using the electrostatic discharge simulator have revealed that changes in the waveform of the discharge current depend not only upon the discharge start voltage across the discharge gap (voltage across the charge-and-discharge current) but also upon the following factor.

The maximum value $I_p$ of the discharge current is not always proportional to the discharge start voltage $V_o$, as denoted by a first curve a in FIG. 4, (it should be noted that in FIG. 4, the horizontal axis denotes the discharge start voltage $V_o$ and the vertical axis denotes the maximum value $I_p$ of the discharge current). In fact, the rate of increase of the maximum value $I_p$ tends to decrease as the discharge start voltage $V_o$ increases. The other curve b in FIG. 4 denotes the theoretical value $I_p$ ($=V_o/R_o$).

In addition, the rise time of the discharge current increases as the discharge start voltage $V_o$ increases, as shown in FIGS. 5(a) through 5(c).

In FIGS. 5(a) through 5(c), the horizontal axis denotes elapsed time and the vertical axis denotes the instantaneous value i of the discharge current. FIG. 5(a) shows the current i when the discharge start voltage $V_o$ is relatively low, FIG. 5(b) shows the current value i when the discharge start voltage $V_o$ is intermediate, and FIG. 5(c) shows the current value i when the discharge start voltage $V_o$ is relatively high. It should be noted that in FIGS. 5(b) and 5(c), the symbol $t_r$ denotes the time required for the current i to reach a magnitude of 90% of peak value from the magnitude of 10%. As appreciated from FIGS. 5(a) through 5(c), as the discharge start voltage $V_o$ increases the rise time of the discharge current tends to increase. In addition, although not shown in FIGS. 5(a) through 5(c), the actual waveforms of the discharge current will exhibit defects such as shown in FIGS. 3(b) through 3(d), i.e., will not conform to the ideal waveform (denoted in dotted lines in FIGS. 3(b) through 3(d)) of the discharge current.

This phenomenon may be due to the following factors. As the discharge start voltage $V_o$ increases, the size of the discharge gap GAP increases. As the size of the discharge gap GAP increases, the electrical field strength across the discharge gap GAP decreases.

FIG. 6 shows an example of the electric field intensity E with respect to the size d of the discharge gap. As shown in FIG. 6, the electric field intensity E remains essentially constant after the size of the discharge gap GAP reaches a certain value.

The increase in the discharge start voltage $V_o$ has a given relationship with the increase in the size of the discharge gap GAP. In addition, the spark discharge phenomenon is related to dielectric breakdown of gas (in this case, air), i.e., a transient phenomenon involving a rapid and radical state change from an insulating state to a conducting state.

Supposing that the above-described transient state change can be considered to be a process of increasing the conductivity within a spark spacing, the speed of the increase in conductivity is determined by the size of the discharge gap and the spatial electric field intensity across the discharge gap under conditions of constant air pressure. Hence, as shown in FIG. 7, as the length of the discharge gap GAP increases in accordance with the increase in the discharge start voltage $V_o$ applied between a fixed discharge electrode $SED_F$ and a movable discharge electrode $SED_M$, the time required for the increase in conductivity $\rho(t)$ of the spark spacing also increases.

As shown in FIG. 8 (the horizontal axis denotes elapsed time t and the vertical axis denotes voltage V and current i), when the discharge is initiated at the time $t=t_o$, part of the electric charge on the charge-and-discharge capacitor $C_{CD}$ is dissipated at the spark spacing as heat loss expressed by $i^2 \cdot 1/\rho(t)$ and is discharged and dissipated into the specimen between the start of discharge and the arrival of the peak value $I_p$ of the discharge current i. Hence, the voltage across the charge-and-discharge capacitor $C_{CD}$ drops below the voltage $V_o$ at the time $t_1$. If the amount of electric charge dissipated at the specimen is q, the reduced voltage v can be expressed as:

$$v = \frac{q}{C_{CD}}$$

If $V_o - v = V_1$, the discharge current i at that time is expressed as follows:

$$i = \frac{V_1}{R_D} = \frac{V_o - v}{R_D}$$

Since at this time the conductivity at the spark spacing will not be at its maximum value, the maximum value $I_p$ of the discharge current (bold solid line in FIG. 8) at this time can be expressed as:

$$I_p = \frac{V_o - v}{R_D + \frac{1}{\rho(t)}}$$

Consequently, the maximum value $I_p$ will be considerably lower than $V_o/R_D$. It should be noted that the thin solid line in FIG. 8 denotes the ideal waveform of the discharge current and the dotted line denotes the voltage waveform of the charge-and-discharge capacitor $C_{CD}$.

The reasons for the various defects in the waveform of the discharge current, i.e. the aberrations form the ideal waveform of the discharge current as shown in FIGS. 3(b) through 3(d)) can be estimated as given below.

Part of the electric charge on the charge-and-discharge capacitor $C_{CD}$ during the increase in conductivity at the spark spacing is dissipated at the spark spacing so that the electric field intensity at the spark spacing during generation of the spark discharge is reduced. The increase of the conductivity is correspondingly suppressed due to the reduction in the electric field intensity. Thus, the conductivity will not conform to the normal increase curve with respect to time but rather assumes the shape of a mesa or other form in which the rate of increase first gradually increases with respect to time and then the conductivity finally decreases after a slight delay.

For this reason, the rise time of the discharge current may lag remarkably behind the theoretical rise time determined by the size d and air pressure P of the discharge gap GAP.

The conventional electrostatic simulator which applies an electric charge to the specimen by way of a spark discharge comprises, as shown in FIG. 9, a variable power supply (battery) $V_s$ having a rated capacity of 0 volts through kilovolts in the thirties, a charge resistor $R_c$, a switch $SW_c$, a charge-and-discharge capacitor $C_{CD}$ having an electrostatic capacity from 50 picofarads to 250 picofarads, a discharge resistor $R_D$ having a resistance value from 100 ohms to 1500 ohms, and discharge electrode SED. The equivalent circuit for the main part of the circuit shown in FIG. 9 is shown in FIG. 10. Stray capacitance $C_g$ having a value from one picofarad to several picofarads is present across the discharge gap GAP between the discharge electrode SED and the opposing electrode $SED_{TO}$, which is actually part of the specimen TO. The magnitude of the stray capacitance $C_g$ is determined by the surface areas of the opposing electrodes SED and $SED_{TO}$, provided that the dielectricity of air in the discharge gap GAP is constant, and varies according to the size of the discharge gap GAP between the electrode SED and the opposite electrode $SED_{TO}$.

Although the presence of the stray capacitance $C_g$ can be neglected at the initial stage of spark discharge since the electric charge in the stray capacitance $C_g$ can quickly dissipate at the spark spacing, the following may occur if the stray capacitance $C_g$ is intentionally increased.

Although at the initial stage of spark discharge across the discharge gap GAP the electric charge across the charge-and-discharge capacitor $C_{CD}$ is sent into the spark spacing via the discharge resistor $R_D$, the amount of charge reaching the spark spacing will be extrmely small due to the limitations set by the spark resistance $1/\rho(t)$ across the discharge gap GAP and discharge resistor $R_D$.

However, since the other electric charge across the stray capacitance $C_g$ is limited only by the spark resistance $1/\rho(t)$ across the discharge gap GAP irrespectively of the discharge resistor $R_D$, the charge transfer will be extremely large compared with the amount of electric charge from the charge-and-discharge capacitor $C_{CD}$. After the conductivity $\rho(t)$ across the discharge gap GAP increases, all of the electric charge across the stray capacitance $C_g$ is sent solely to the spark spacing. When the impedance of the current path connecting the stray capacitance $C_g$ and the discharge gap GAP is reduced, the speed at which the electric charge across the stray capacitance $C_g$ enters the spark spacing can be increased. Consequently, the arc can cross the discharge gap GAP with little loss of the electric charge from the charge-and-discharge capacitor $C_{CD}$.

The output energy in the electrostatic discharge simulator is denoted by i in FIG. 10 and is determined by the current through the discharge gap GAP from the charge-and-discharge capacitor $C_{CD}$, and is independent of the electric charge within the stray capacitance $C_g$.

SUMMARY OF THE INVENTION

With the results of the above-described experiment in mind, it is an object of the present invention to provide an apparatus for simulating electrostatic discharge in which an electrostatic capacitance element is connected in parallel with a discharge gap to intentionally increase the stray capacitance present across the discharge gap and in which the impedance in the current path between the parallel-connected electrostatic capacitance element and discharge gap is extremely low or zero. Thus if the electrostatic capacitance of the charge-and-discharge capacitor, the resistance of the discharge resistance $R_D$, and the discharge start voltage $V_o$ (i.e., the length of the discharge gap GAP) vary, the electrical characteristics such as distorsion of the waveform of the discharge current (i.e., aberrations near peak of the discharge current waveform or in the rising edge of the discharge current waveform), the rise time of the discharge current, and so on can be improved remarkably as compared to conventional apparata and statistical dispersion of the above-described electrical characteristics due to uncertainties in the spark discharge generation mechanism can be extremely limited.

According to one aspect of the present invention, an apparatus for simulating electrostatic discharge, comprising: (a) first means for applying an electrostatic discharge substantially equivalent to that generated by an electrified human body to an object to be tested, and (b) second means for shortening the rise time of the discharge current of the electrostatic discharge from the first means and increasing the peak value of the discharge current.

According to another aspect of the present invention, an apparatus for simulating electrostatic discharge, comprises: (a) a first electrostatic capacitance element capable of accumulating a given amount of electric charge, (b) a first resistor, (c) a discharge gap across which a spark discharge is to occur, (d) first means for supplying the given amount of electric charge in the first electrostatic capacitance element to an object to be tested via the first resistor and the discharge gap, and (e) a second electrostatic capacitance element connected in parallel with the discharge gap.

BRIEF DESCRIPTION OF THE DRAWINGS

A more complete understanding of the present invention may be obtained from the following detailed description taken in conjunction with the attached drawings in which

FIG. 11 is a circuit wiring diagram of an electrostatic discharge simulator of a first preferred embodiment according to the present invention;

FIG. 12 is a side view of an essential part of a second preferred embodiment;

DETAILED DESCRIPTION OF THE PREFERRED EMBODIMENTS

Figure 1:
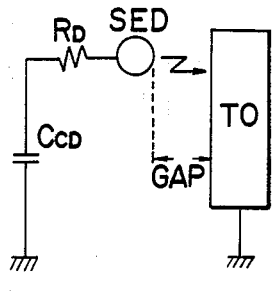
FIG. 1 is a circuit block diagram of an essential part of a conventional electrostatic discharge simulator.
Figure 2:
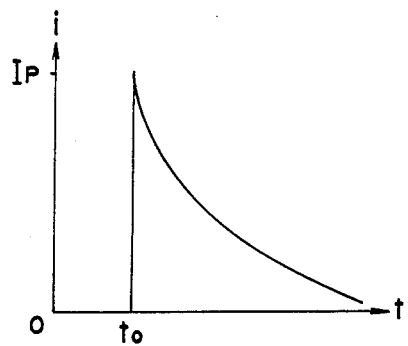
FIG. 2 is a graph of the theoretical waveform of a discharge current with respect to time.
Figure 3A:
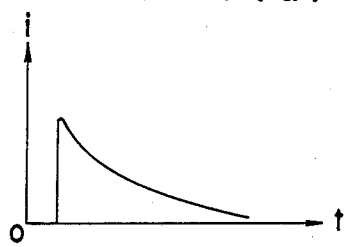
FIGS. 3(a) through 3(d) are graphs of actual waveforms of discharge currents under various conditions.
Figure 3B:
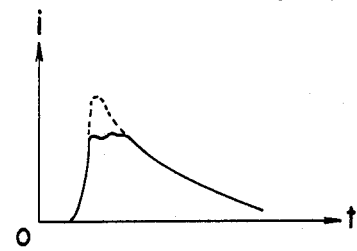
Figure 3C:
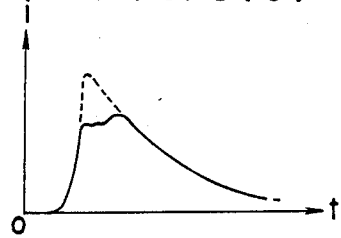
Figure 3D:
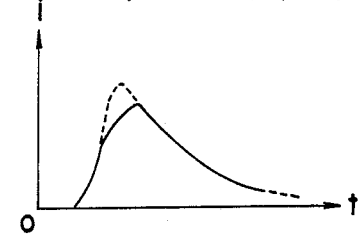
Figure 4:
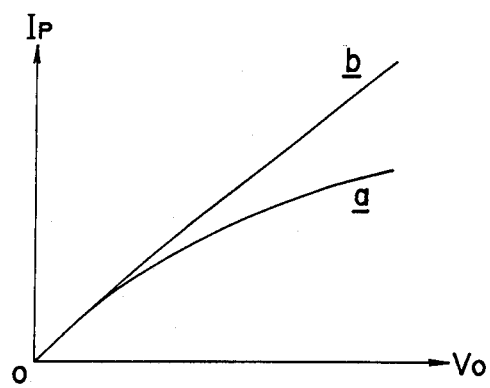
FIG. 4 is a graph of the peak value of the discharge current with respect to discharge start voltage.

Reference will hereafter be made to the drawings in order to facilitate understanding of the present invention.

FIG. 11 shows a first preferred embodiment of the electrostatic discharge simulator.

In FIG. 11, the symbol VS denotes a DC power supply, the symbol $R_c$ denotes a charge resistor, and the symbol $SW_c$ denotes a switch for controlling a charge. It should be noted that the switch $SW_c$ may be omitted when using a suitably high-resistance resistor as the charge resistor $R_c$. In addition, the symbols $ED_1$ and $ED_2$ denote opposing electrodes having flat peripheral portions and central recessed portions (projecting when viewed from outside). Symbol $R_H$ denote a high resistance inserted between one electrode $ED_2$ and ground. Symbol $CDT_{RE}$ denotes a supporting conductor, one end of which is connected to a discharge resistor RD and the other end of which is attached to a central part of the projecting portion of the other electrode $ED_1$. Symbol $SED_F$ denotes a fixed discharge electrode fixed into the recessed part of the other electrode $ED_1$.

It should be noted that a hole may penetrate the central part of the electrode $ED_1$, with one end of the supporting conductor $CDT_{RE}$ fitted into the hole, and that end of the supporting conductor $CDT_{RE}$ may be attached to the fixed discharge electrode $SED_F$. Symbol $CDT_M$ denotes a bar-shaped movable conductor, an outer end of which tapers to a point to serve as a contact CTT for the specimen. The inner end thereof is slidably inserted into a hole penetrating the central part of the electrode $ED_2$, a movable discharge electrode $SED_M$ being fixedly attached to the inner end of the movable conductor $CDT_M$.

In place of inserting the bar-shaped movable conductor $CDT_M$ slidably into the hole penetrating the electrode $ED_2$, threads may be formed around an outer periphery of the bar-shaped movable conductor $CDT_M$, and around the inner surface of the hole at the center of the electrode $ED_2$ so that the bar-shaped movable conductor $CDT_M$ can be screwed into the threaded hole and the bar-shaped movable conductor $CDT_M$ can be manually rotated or alternatively a feed-screw mechanism may be disposed between the bar-shaped movable conductor $CDT_M$ and the electrode $ED_2$ for turning the bar-shaped movable conductor $CDT_M$ clockwise or counterclockwise so as to drive the bar-shaped movable conductor $CDT_M$ forward or backward. If the electrode $ED_2$ is thin, a relatively long cylindrical nut NUT can be fixed to the outer surface of the central part of the electrode $ED_2$ and the bar-shaped movable conductor $CDT_M$ screwed into the nut.

In addition, symbol DIE denotes a dielectric material filling the gap between the opposing electrodes $ED_1$ and $ED_2$.

It should be noted that elements such as electrodes $ED_1$, $ED_2$, supporting conductor $CDT_{RE}$, discharge resistor $R_D$, switch $SW_c$, charge-and-discharge capacitor $C_{CD}$, and charge resistor $R_c$ are integrally covered with a suitable insulating material in order to facilitate handling and to ensure a safety. The insulating covering may be omitted around the electrode $ED_2$.

The DC power supply VS can charge up to several tens of kilovolts, the charge-and-discharge capacitor $C_{CD}$ has a capacitance suitably selected from 50 picofarads to 250 picofarads, and the discharge resistor $R_D$ has a resistance suitably selected from 100 ohms to 1500 ohms.

Although both fixed discharge electrode $SED_F$ and movable discharge electrode $SED_M$ are spherical as shown in FIG. 1, they may both or either be needle-shaped.

It should be noted that, given a suitably deep recessed part at the centers of each of the opposing electrodes $ED_1$ and $ED_2$, the length of the discharge gap GAP between the discharge electrodes $ED_1$ and $ED_2$ can be changed over a required range. The gap between the peripheries of the opposing electrodes $ED_1$ and $ED_2$ is sufficiently narrow and the opposing surface area is so wide that the electrostatic capacitance at the required value can be achieved.

Furthermore, if the opposing relationship between the electrodes $ED_1$ and $ED_2$ can be held with sufficient mechanical strength, e.g. by means of an insulating material covering the outer periphery of the opposing electrodes $ED_1$ and $ED_2$, then there need be no dielectric material DIE between the opposing electrodes $ED_1$ and $ED_2$.

With the switch $SW_c$ closed, the charge-and-discharge capacitor $C_{CD}$ is charged to a required voltage via a charge resistor $R_c$ and electric charge accumulates in the space between the opposing electrodes $ED_1$ and $ED_2$ via the discharge resistor $R_D$, supporting conductor $CDT_{RE}$, and high resistor $R_H$. The bar-shaped movable conductor $CDT_M$ is then moved axially until the discharge gap GAP between the fixed discharge electrode $SED_F$ and movable discharge electrode $SED_M$ corresponds to the charge voltage of the charge-and-discharge capacitor $C_{CD}$.

When the contactor CTT formed at the outer end of the bar-shaped movable conductor $CDT_M$ contacts a desired part of the specimen, all of the electric charge across the opposing electrodes $ED_1$ and $ED_2$ is sent quickly into the spark spacing via the opposing electrodes $ED_1$, $ED_2$, supporting conductors $CDT_{RE}$, fixed discharge electrode $SED_F$, and bar-shaped movable conductor $CDT_M$. Consequently, an arc crosses the discharge gap GAP with little loss of electric charge across the charge-and-discharge capacitor $C_{CD}$ so that almost all of the electric charge across the charge-and-discharge capacitor is instantaneously applied to the specimen. In this case if the resistance value of the resistor $R_H$a between the electrode $ED_2$ and ground is sufficiently high compared with the impedance of the specimen, no discharge current will be diverted to the resistor $R_H$.

It should be noted that with the end of the supporting conductor $CDT_{RE}$ attached to the outer surface of the central part of the electrode $ED_1$ and the fixed discharge electrode $SED_F$ attached to the inner surface at the center part of the electrode $ED_1$, the supporting conductor $CDT_{RE}$ is not involved in the transfer of the electric charge developed between the electrodes $ED_1$ and $ED_2$.

FIG. 12 shows an essential part of a second preferred embodiment according to the present invention. In FIG. 12, symbol $SED'_F$ denotes a fixed discharge electrode comprising the bar-shaped conductor. The inner end of the fixed discharge electrode $SED'_F$ is hemispherical. Symbol DIE denotes a dielectric material layer surrounding the entire outer peripheral surface of the fixed discharge electrode $SED'_F$ except for the semispherical end. The outer surface of the dielectric layer DIE is threaded. Symbol $ED_P$ denotes an electrode made up of a bell-shaped conductor threaded on the inside to match the threads on the outside of the dielectric layer DIE. Symbol $SED_M$ denotes a movable discharge electrode fixed to the inner surface of the sealed end of the electrode $ED_P$. Symbol CTT denotes a contact designed to touch the specimen and, accordingly, which projects outwardly from the center of an outer surface of the sealed end of the electrode $ED_P$.

It should be noted that the discharge resistor, charge-and-discharge capacitor, switch, and power supply are connected to the fixed discharge electrode $SED'_F$ and all parts at high voltage should be covered with an insulating material in the same way as described in the first preferred embodiment.

The electrode $ED_P$ can be rotated clockwise or counterclockwise to move the electrode $ED_P$ forward or backward until the discharge gap GAP between the fixed discharge electrode $SED'_F$ and the movable discharge electrode $SED_M$ is set to correspond to the voltage across the charge-and-discharge capacitor, i.e., discharge start voltage. Thereafter, the contactor CTT is brought into contact with the part of the specimen in question. At this time, all of the accumulated electric charge between the fixed discharge electrode $SED'_F$ and the bell-shaped electrode $ED_F$ is quickly applied to the spark spacing so that an arc crosses the discharge gap GAP with little loss of electric charge across the charge-and-discharge capacitor and almost all of the electric charge is instantaneously applied to the specimen.

Although FIG. 12 shows the dielectric manual layer DIE attached to the outer peripheral surface of the fixed discharge electrode $SED'_F$ and its outer surface threaded for engagement with the threads on the inner surface of the bell-shaped electrode $ED_P$, the dielectric material layer may be fixed to the inner periphery of the bell-shaped electrode $ED_P$ and the inner surface thereof and the outer surface of the fixed discharge electrode $SED'_F$ may be threaded together. Alternatively, in place of moving the bell-shaped electrode $ED_P$ axially by means of screw threads, the bell-shaped electrode can be fitted into the outer periphery of the fixed discharge electrode $SED'_F$ so as to enable the bell-shaped electrode to slide axially.

It should be noted that in the second preferred embodiment as the discharge gap GAP varies as the bell-shaped electrode $ED_P$ is moved axially, the opposing areas of the fixed discharge electrode $SED'_F$ and the bell-shaped electrode $ED_P$ also vary, whereby the electrostatic capacitance therebetween varies.

Although the longer the discharge gap GAP, i.e. the higher the discharge start voltage $V_o$, the larger the required electrostatic capacitance between the fixed discharge electrode and bell-shaped electrode $ED_P$, and the smaller the electrostatic capacitance between the fixed discharge electrode $SED'_F$ and bell-shaped electrode $ED_P$ actually becomes. Consequently, the object of the present invention may not sufficiently be achieved over the full desired range of discharge voltage.

Figure 13:
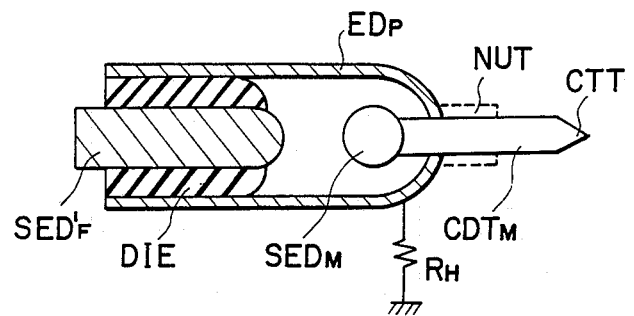
FIG. 13 is a side view of an essential part of a third preferred embodiment.

FIG. 13 shows an essential part of a third preferred embodiment which can eliminate the above-described limitation of the second preferred embodiment.

In FIG. 13, there are no threads formed on the outer peripheral surface of the dielectric material layer or the inner peripheral surface of the bell-shaped electrode $ED_P$ but rather the electrode $SED'_F$ is fixed to the dielectric material layer DIE and the electrode $JED_P$ is fixed to the dielectric material layer DIE. The outer end of the bar-shaped movable conductor $CDT_M$ tapers to a point to form the contact CTT for contact with the specimen and its inner end is attached to the movable discharge electrode $SED_M$. The bar-shaped movable conductor $CDT_M$ may pass movably through a hole penetrating the central part of the sealed end of the electrode $ED_P$ or a feed screw on the outer peripheral surface of the bar-shaped movable conductor $CDT_M$ may be threaded into a threaded hole through the central part of the sealed end of the electrode $ED_P$.

If the sealed end of the electrode $ED_P$ is thin, a relatively long nut NUT is fixed on the outer surface of the sealed end to enhance its mechanical strength. In addition, if the bar-shaped movable conductor $CDT_M$ is screwed into the sealed end of the electrode $ED_P$, the bar-shaped movable conductor $CDT_M$ may be turned manually or the feed screw mechanism such as is used in micrometers may be used to turn the bar-shaped movable conductor in the same way as in the first preferred embodiment shown in FIG. 11.

Although the bar-shaped movable conductor $CDT_M$ moves axially to adjust the discharge gap GAP to a length corresponding to the discharge start voltage, the electrostatic capacitance between the electrodes $SED'_F$ and $ED_P$ will not vary even though the length of the discharge gap GAP changes so that a stable discharge can be achieved.

Figure 14:
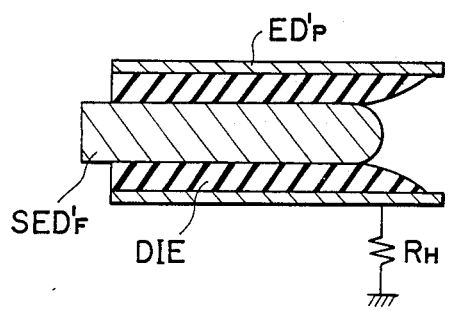
FIG. 14 is a side view of an essential part of a fourth preferred embodiment.

FIG. 14 shows an essential part of a fourth preferred embodiment according to the present invention. Symbol $SED'_F$ denotes a fixed discharge electrode made up of a bar-shaped conductor, the inner end of which is hemispherical. Symbol DIE denotes the dielectric material layer installed so as to enclose integrally the outer peripheral surface of the fixed discharge electrode $SED'_F$ except the semispherical end.

In FIG. 14, the electrode $ED'_P$ is in the form of a cylindrical sleeve. The electrode $ED'_P$ fits over the outer periphery of the dielectric material layer DIE so as to allow movement of the electrode $ED'_P$ axially. The outer peripheral surface of the dielectric material layer DIE and the inner peripheral surface of the bell-shaped electrode $ED'_P$ are threaded and the bell-shaped electrode $ED'_P$ can be rotated clockwise or counterclockwise to move forward or backward. Instead of fixing the dielectric material layer DIE to the outer peripheral surface of the fixed discharge electrode $SED'_P$ the dielectric material layer DIE is attached to the inner peripheral surface of the cylindrical electrode $ED'_P$ so that the cylindrical electrode $ED_P'$ is integral with the dielectric material layer DIE and so slides axially with the cylindrical electrode. Alternatively, feed screws may be provided on the outer peripheral surface of the fixed discharge electrode $SED'_F$ and on the inner peripheral surface of the dielectric layer DIE, respectively, so that the cylindrical electrode $ED'_P$ and dielectric material layer DIE are integral and can be rotated clockwise or counterclockwise to move axially.

After the cylindrical electrode $ED'_P$ is moved axially until the discharge gap GAP between the surface of the specimen $T_o$ enclosed at the end of the cylindrical electrode $ED'_P$ and the semispherical end of the fixed discharge electrode $SED'_F$ corresponds to the required discharge start voltage, the end of the cylindrical electrode $ED'_P$ is brought into contact with required point of the specimen. At this time, the electric charge between the fixed discharge electrode $SED'_F$ and cylindrical electrode $ED'_P$ crosses the spark spacing, e.g. the discharge test can be carried out in the same way as described in each preferred embodiment.

It should be noted that although in each preferred embodiment the electrostatic capacitance connected in parallel to the discharge gap GAP is formed in the construction of electrodes shown in FIGS. 11 and 14, any arbitrary means may be used to facilitate high-speed movement of the electric charge into the discharge gap. For example, a single capacitor may be connected across the discharge gap.

In addition, the present invention is not only applicable to the electrostatic discharge simulator in which the spark discharge across the discharge gap applies electrical charge to the specimen but is also applicable to an electrostatic discharge generation simulator in which the electric charge is applied to the specimen via mechanical contacts or relay contacts.

Figure 15:
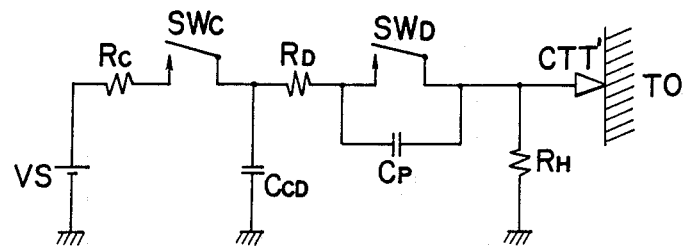
FIG. 15 is a circuit wiring diagram of a fifth preferred embodiment.

FIG. 15 shows a fifth preferred embodiment of the latter type of electrostatic discharge simulator. The structure and operation of the DC power supply VS, discharge resistor $R_c$, switch $SW_c$, charge-and-discharge capacitor $C_{CD}$, and discharge resistor $R_D$ are the same as in the previous embodiments. A discharge control switch $SW_D$ comprises a switch suitable for high-speed gating of a high-voltage circuit, such as a mercury switch or vacuum switch. In addition, a capacitor $C_P$ is connected across the switch $SW_D$. The symbol CTT' denotes a bar-shaped contact. Symbol $R_H$ denotes a high-resistance resistor.

Figure 5A:
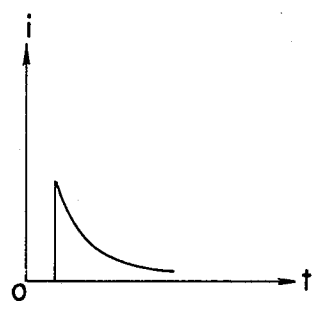
FIGS. 5(a) through 5(c) are graphs of discharge currents with respect to time under differing conditions.
Figure 5B:
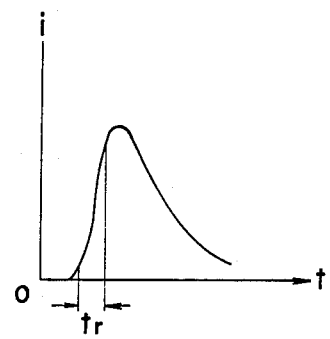
Figure 5C:
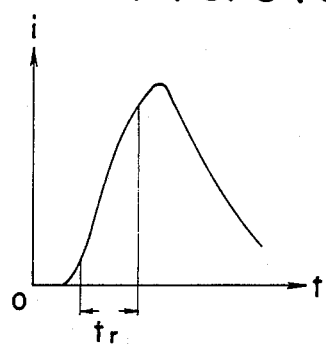
Figure 6:
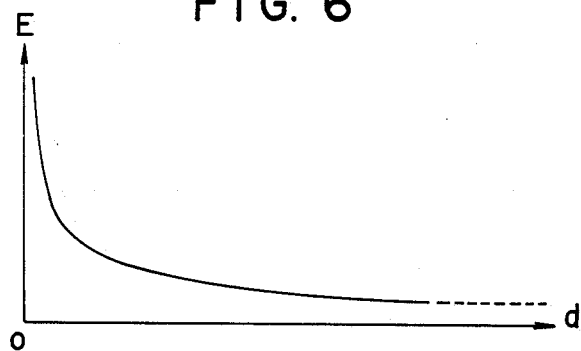
FIG. 6 is a graph of the relationship between the size of the discharge gap and electric field intensity.
Figure 8:
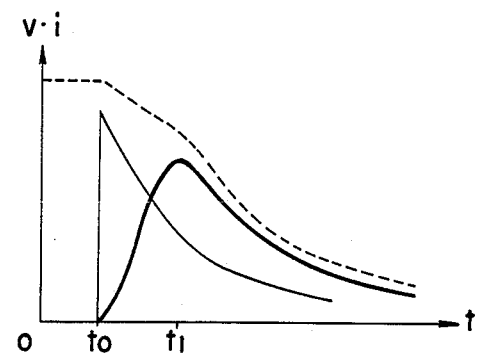
FIG. 8 shows characteristic curves representing the values of discharge current and discharge start voltage with respect to time.
Figure 7:
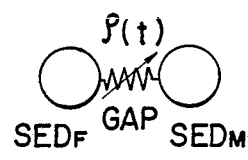
FIG. 7 is a diagram of the effect of the discharge gap between a fixed electrode and a movable electrode.
Figure 9:
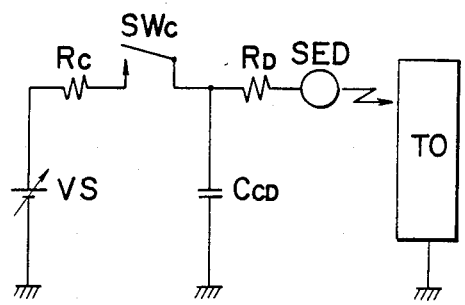
FIG. 9 is a circuit wiring diagram of the conventional electrostatic discharge simulator.
Figure 10:
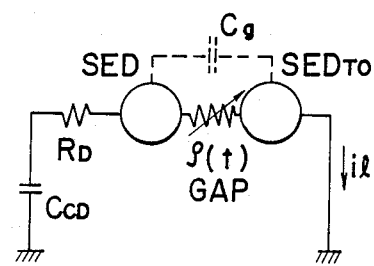
FIG. 10 is a circuit diagram of the equivalent circuit of the essential prat of the electrostatic discharge simulator shown in FIG. 9.

When, in the example shown in FIG. 5, the charge control switch $SW_c$ is closed to charge the capacitor $C_{CD}$ to a required voltage value and thereafter the tip of the contactor CTT' is brought into contact with the required point of the specimen $T_o$, and the discharge control switch $SW_D$ is closed, the electric charge on the capacitor $C_P$ connected across the switch $SW_D$ is quickly discharged between the contacts, so that the electric charge of the charge-and-discharge capacitor $C_{CD}$ is applied instantaneously to the specimen with little loss.

Figure 16:
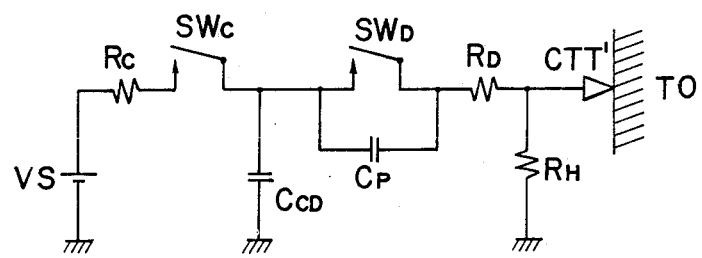
FIG. 16 is a circuit wiring diagram of a sixth preferred embodiment.

FIG. 16 shows a sixth preferred embodiment in which the discharge resistor $R_D$ is connected after the discharge control switch $SW_D$. The operation of the sixth preferred embodiment is the same as that of the fifth embodiment. In this embodiment, the discharge resistor $R_D$ can be housed with the contact CTT' to miniaturize the simulator.

Figure 17:
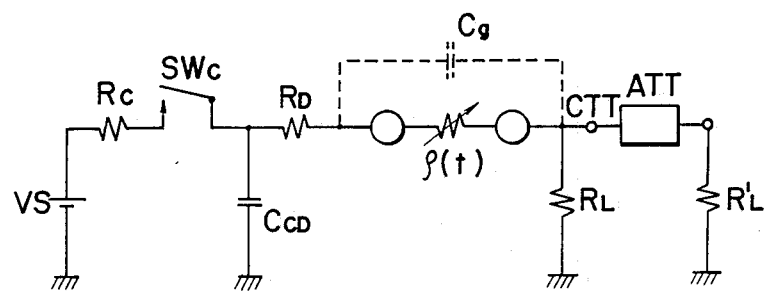
FIG. 17 is a circuit wiring diagram of an equivalent circuit of the electrostatic discharge simulator shown in FIG. 11.

FIG. 17 shows the equivalent circuit of the first preferred embodiment shown in FIG. 11.

As shown in FIG. 17, the output voltage $V_o$ of the charging power supply VS is held at 15 kilovolts, the electrostatic capacitance of the charge-and-discharge capacitor $C_{CD}$ is held at 120 picofarads, the resistance of the discharge resistor $R_D$ is held at 250 ohms, and a load resistor $R_L$ with a resistance of 62.5 ohms is connected across the contact CTT. The output current at the contact CTT is sent to a second load resistor $R_L'$ with a resistance of 50 ohms, via an attenuator ATT having an attenuation factor of 40 dB. The load current is observed through a cathode-ray tube oscilloscope. The pattern of change of the waveform of the discharge current as the electrostatic capacitance $C_g$ between the opposing electrodes $ED_1$ and $ED_2$ connected in parallel with the discharge gap GAP varies is shown in FIGS. 18(a) through 18(c).

Figure 18A:
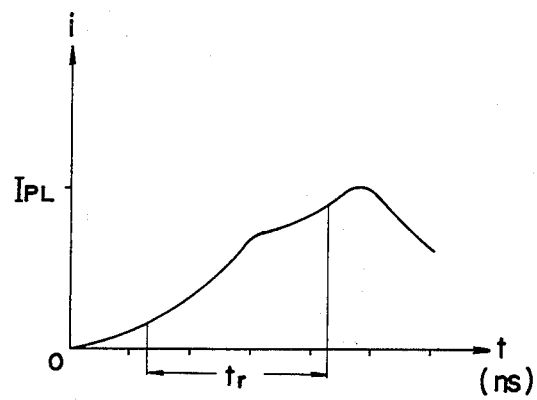
FIGS. 18(a) through 18(c) are graphs of the discharge current with respect to time.
Figure 18B:
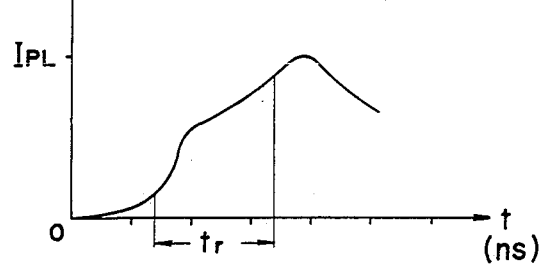
Figure 18C:
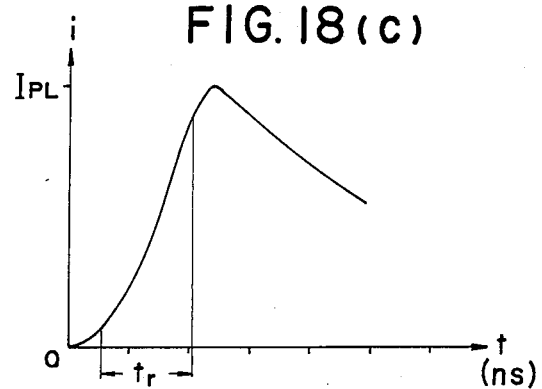

In FIGS. 18(a) through 18(c), the horizontal axis represents time t (nanoseconds) on a scale of 5 nanoseconds and the vertical axis represents of the load current i normalized to $V_o(R_o+R')$ (R' denotes a effective resistance of the resistors $R_L$ and $R_L'$). The symbol $I_{PL}$ denotes the peak value of the load current, and the symbol tr denotes the time required for the load current to rise from 10% of its peak value $I_{PL}$ to 90% of its peak value. FIG. 18(a) shows the pattern of change when the electrostatic capacitance $C_g$ is zero picofarads, $I_{PL}=35.7A$ and tr=15 nanoseconds. FIG. 18(b) shows the pattern of change when $C_g$ is approximately 5 picofarads, $I_{PL}=35.7A$ and tr=10 nanoseconds. FIG. 18(c) shows the pattern of change when $C_g$ is 150 picofarads, $I_{PL}=58.9A$ and tr=7.5 nanoseconds. In the second curve b, when $V_o=16$ kV the current $I_{PL}$ is 57.1 Amperes (A) which is 99 percent (%) of the above-desribed theoretical value. It is noted that the curve line c represents the case in which no parallel electrostatic capacitance shunts across the discharge gap GAP and when $V_o=16$kV the pea value $I_{PL}$ is 38A (Amperes) which is only about 66% of the theoretical value.

The table given below shows the voltage drop $V_L$ across the load resistor $R_L'$ for varying values of the discharge start voltage $V_o$, as well as, the peak value $I_{PL}$ of the load current ($=V_L \times 3.57$), and the theoretical peak value $I_r$ of the load current derived from the expression $V_o/(R_o+R')$.

As appreciated from FIGS. 18(a) through 18(c), in the simulator according to the present invention the rise time tr of the load current, i.e., discharge current can be shortened and the maximum value $I_{PL}$ can be increased beyond those of the conventional simulator, i.e., as compared with the situation in which the electrostatic capacitance is zero picofarads (FIG. 18(a)). However, as appreciated from FIG. 18(b), in cases where the additional electrostatic discharge capacitance $C_g$ is relatively small, although the time shortening can be observed in the first half of the rising slope, this time shortening is not observed in the second half of the rising slope and in addition, no increase in the peak value $I_{PL}$ is observed. On the other hand, as can be appreciated from FIG. 18(c), the stabilization of the waveform of the discharge current may be due to the great contribution of the supply of energy from the parallel-connected electrostatic capacitance element in cases where the resistance value of the discharge resistor $R_D$ is relatively large and the electrostatic capacitance of the charge-and-discharge capacitor $C_{CD}$ is relatively small, i.e., in cases where the energy for the spark is so small that no stable discharge pulse can be formed.

Figure 19:
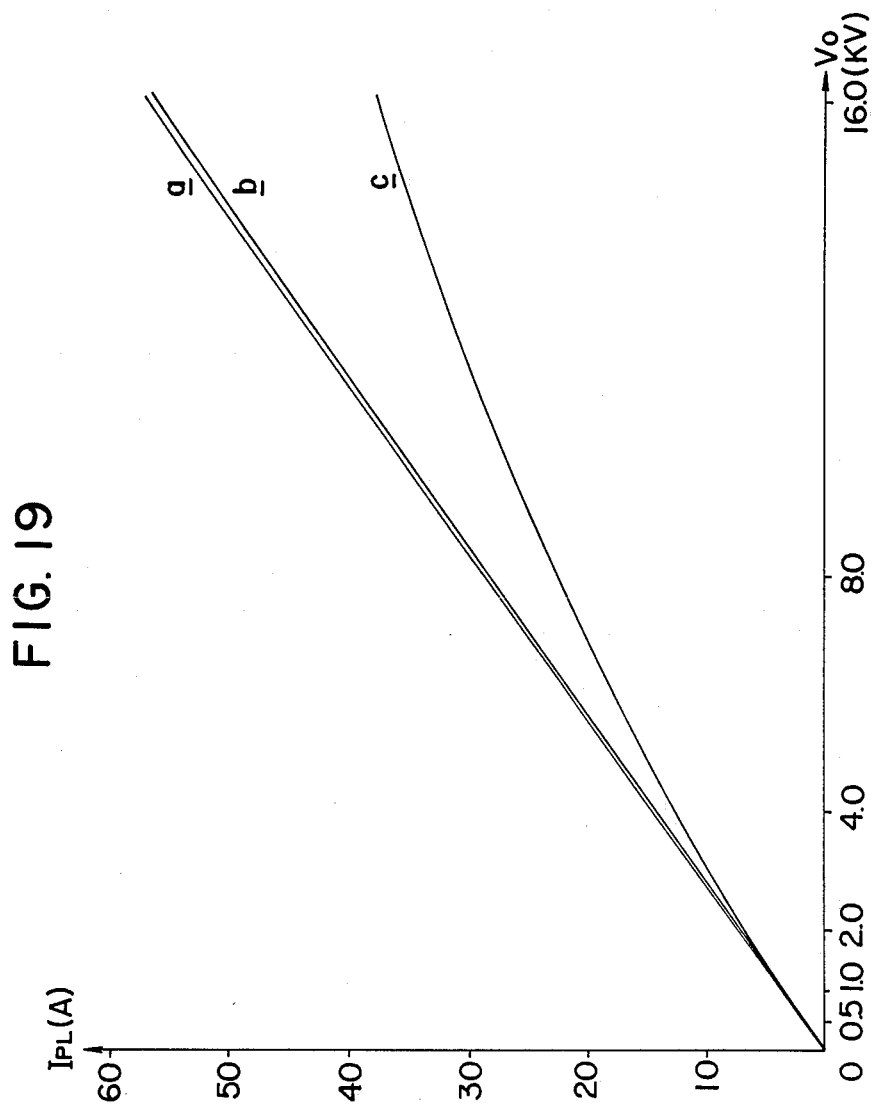
FIG. 19 is a graph of the peak value of load current with respect to discharge start voltage.

FIG. 19 shows characteristic curves representing the peak value $I_{PL}$ of the load current when the electrostatic capacitance $C_g$ is selected as 150 picofarads connected in parallel with the discharge gap GAP in the equivalent circuit shown in FIG. 17 as a function of the discharge start voltage $V_o$ varying over the range from 0.5 kilovolts to 16 kilovolts with the capacitance value, resistance value, and amount of attenuation held at the same levels as in FIG. 17. The horizontal axis represents the discharge start voltage $V_o$ (kV) and the vertical axis represents the peak value $I_{PL}$ (A) of the load current. The first curve a represents the theoretical value, i.e., the peak value based on the expression $V_o/(R_D+R')$. In the first curve a, $I_{PL}=57.6$ Amperes (A) when $V_o=16$ kilovolts (kV). The second curve b represents the actual value when the electrostatic capacitance of 150 picofarads bridges the discharge gap GAP and the ratio (%) of the peak value $I_{PL}$ and the theoretical value $I_r$.

| $V_o$ (kV) | $V_L$ (V) | $I_{PL}$ (A) | $I_r$ (A) | % |
| --- | --- | --- | --- | --- |
| 0.5 | 0.44 | 1.6 | 1.8 | 89 |
| 1.0 | 1.86 | 3.1 | 3.6 | 86 |
| 2.0 | 1.75 | 6.3 | 7.2 | 88 |
| 4.0 | 3.6 | 12.9 | 14.4 | 90 |
| 8.0 | 7.0 | 25.0 | 28.8 | 87 |
| 16.0 | 16.0 | 57.1 | 57.6 | 99 |

As appreciated from FIG. 19 and the above table, in the conventional case in which no electrostatic capacitance element is connected across the discharge gap, part of the electric charge in the charge-and-discharge capacitor $C_{CD}$ is lost during the process of the spark discharge. Therefore, the peak value $I_{PL}$ of the load current is suppressed to a considerably lower value than the theoretical value. However, if the parallel electrostatic capacitor of 150 picofarads is additionally connected across the discharge gap GAP, the peak value of the discharge current will be extremely close to the theoretical value so that the electric charge on the charge-and-discharge capacitor is applied to the specimen with little loss.

As described hereinabove, since in the simulator according to the present invention, the electrostatic capacitance element is connected across the discharge gap or across the discharge control switch, the rise time of the discharge current is shortened to increase the peak value of the discharge current and the waveform of the discharge current is improved so that the dispersion of the electrical characteristics of the discharge phenomenon can extremely be small.

It will clearly be appreciated from the foregoing description that the foregoing description is made in terms of the preferred embodiments and various changes and modifications may be made without departing from the scope of the present invention which is to be defined by the appended claims.

What is claimed is:

1. An apparatus for simulating electrostatic discharge, comprising:
   (a) first means for applying an electrostatic discharge substantially equivalent to that generated by an electrified human body to an object to be tested, the first means comprising a first electrostatic capacitor and third means including a space defining a gap for supplying energy built up in said first electrostatic capacitance element to said object to be tested via a first resistor and via said gap across which the electrostatic discharge occurs; and
   (b) second means for shortening the rise time of the discharge current of the electrostatic discharge from said first means and increasing the peak value of the discharge current, said second means comprising a second electrostatic capacitance element connected across said gap for charging a given amount of electric charge across said gap and discharging the given amount of electric charge across said gap before said third means supplies the energy accumulated by the first electrostatic capacitance element to the object to be tested.

2. The apparatus according to claim 1, wherein said first means further comprises:
   means for applying a predetermined voltage across said first electrostatic capacitor.

3. The apparatus according to claim 2, wherein said second means comprises:
   a current path for quickly applying the discharged electric charge of said second electrostatic capacitor to said gap.

4. The apparatus according to claim 3, wherein said second electrostatic capacitance element has one end thereof grounded via a second resistor.

5. The apparatus according to claim 2, wherein said third means comprises:
   a switch connected to said first resistor;
   a contact connected to said switch and with which said object is touched; and
   a second resistor connected between said contact and ground.

6. The apparatus according to claim 5, wherein said second electrostatic capacitance element is connected across said switch.

7. The apparatus according to claim 6, wherein said switch is a switch suitable for high-speed switching in circuits handling voltage on the order of kilovolts.

8. An apparatus for simulating electrostatic discharge, comprising:
   (a) a first electrostatic capacitance element capable of accumulating a given amount of electric charge;
   (b) a first resistor;
   (c) a discharge gap across which a spark discharge is to occur;
   (d) first means for supplying the given amount of electric charge in said first electrostatic capacitance element to an object to be tested via said first resistor and said discharge gap; and
   (e) a second electrostatic capacitance element connected in parallel with said discharge gap.

9. The apparatus according to claim 8, wherein said first means comprises:
   (a) a supporting conductor, one end connected to said first resistor and the other end having a fixed discharge electrode; and
   (b) a movable conductor, one end having a axially movable discharge electrode facing said fixed discharge electrode to form said discharge gap and the other end havig a contact with which said object is contacted so that the length of said gap is variable.

10. The apparatus according to claim 9, wherein said second electrostatic element comprises:
    (a) a first electrode plate attached to said supporting conductor; and
    (b) a second electrode plate opposing said first electrode plate and supporting said movable discharge electrode so as to enable axial movement of said movable discharge electrode.

11. The apparatus according to claim 9, wherein said supporting conductor is bar-shaped, one end thereof being connected to said first resistor and the other end serving as the fixed discharge electrode and wherein said second electrostatic capacitance element comprises:
    said bar-shaped supporting conductor, the elongated surface of which serves as a first electrode plate; and
    a second electrode plate opposing the elongated surface of said bar-shaped supporting conductor and supporting said bar-shaped supporting conductor and movable conductor so as to enable movement of both along their aligned axes.

12. The apparatus according to claim 10, wherein a gap between said first and second electrode plates is filled with a dielectric material.

13. The apparatus according to claim 9, wherein at least one of said fixed discharge electrode of the supporting conductor and said movable discharge electrode of the movable conductor is spherical.

14. The apparatus according to claim 9, wherein at least one of said fixed discharge electrode of the supporting conductor and said movable discharge electrode of the movable conductor tapers to a point.

15. The apparatus according to claim 9, wherein said first means further comprises a second resistor, electrically connected between said movable conductor and ground, having a resistance value considerably larger than that said object normally has.

16. The apparatus according to claim 10, wherein said first means further comprises second means for increasing the mechanical strength of said movable discharge electrode and second electrode plate.

17. The apparatus according to claim 16, wherein said second means is a nut, the threaded portion of which mates with an elongated surface of said movable discharge electrode and which is in contact with a center part of said second electrode plate.

18. The apparatus according to claim 8, wherein said discharge gap is constituted by a switch and said second electrostatic capacitance element is connected in parallel with said switch.

19. The apparatus according to claim 18, wherein said first means comprises:
   a contact connected between said switch and said object and with which the tested object is touched; and
   a second resistor connected between said switch and said contact,
   and wherein said first electrostatic capacitance element is connected between said switch and ground.

* * * * *